United States Patent
Langer et al.

(10) Patent No.: US 8,198,628 B2
(45) Date of Patent: Jun. 12, 2012

(54) DOPED SUBSTRATE TO BE HEATED

(75) Inventors: Robert Langer, Grenoble (FR); Hacène Lahreche, Paris (FR)

(73) Assignee: Soitec, Bernin (FR)

( * ) Notice: Subject to any disclaimer, the term of this patent is extended or adjusted under 35 U.S.C. 154(b) by 385 days.

(21) Appl. No.: 12/530,606

(22) PCT Filed: Mar. 25, 2008

(86) PCT No.: PCT/IB2008/000780
§ 371 (c)(1),
(2), (4) Date: Sep. 9, 2009

(87) PCT Pub. No.: WO2008/120092
PCT Pub. Date: Oct. 9, 2008

(65) Prior Publication Data
US 2010/0044705 A1     Feb. 25, 2010

(30) Foreign Application Priority Data

Mar. 30, 2007   (FR) .................................... 07 54175

(51) Int. Cl.
    *H01L 29/04*     (2006.01)
(52) U.S. Cl. .......... 257/51; 257/227; 257/E31.11; 257/E31.13; 257/E31.131; 438/478; 438/493; 438/495; 438/510; 438/514; 438/530; 117/90; 117/94; 117/104
(58) Field of Classification Search .......... 117/90, 117/94, 104; 257/51, 227, E31.11; 438/478, 438/689
See application file for complete search history.

(56) References Cited

U.S. PATENT DOCUMENTS

| 5,242,862 | A |   | 9/1993 | Okabe et al. ............... 437/225 |
| 5,296,385 | A | * | 3/1994 | Moslehi et al. ............ 438/514 |
| 5,654,904 | A | * | 8/1997 | Thakur ....................... 702/137 |
| 5,913,974 | A | * | 6/1999 | Habuka ........................ 117/3 |
| 6,245,692 | B1| * | 6/2001 | Pearce et al. ............... 438/795 |
| 6,413,312 | B1| * | 7/2002 | Kawai et al. ............... 117/104 |
| 6,447,604 | B1| * | 9/2002 | Flynn et al. ................ 117/89 |

(Continued)

FOREIGN PATENT DOCUMENTS

EP          0 449 524       10/1991

(Continued)

OTHER PUBLICATIONS

International Search Report, PCT/IB2008/000780, mailed Jul. 30, 2008.

(Continued)

*Primary Examiner* — Minh-Loan T Tran
*Assistant Examiner* — William Harriston
(74) *Attorney, Agent, or Firm* — Winston & Strawn LLP

(57) ABSTRACT

A semiconductor structure that is to be heated. The structure includes a substrate for the front face deposition of a useful layer intended to receive components for electronics, optics or optoelectronics. The structure contains doped elements that absorb infrared radiation so as to substantially increase infrared absorption by the structure so that the front face reaches a given temperature when a given infrared power is supplied to the structure. At least one part of the doped elements have insufficient electrical activity or localization in the structure, such that they cannot disturb the operation of the components. In addition, a method of producing this structure and a method of forming a useful layer of semiconductor material on the structure.

25 Claims, 1 Drawing Sheet

U.S. PATENT DOCUMENTS

| | | | |
|---|---|---|---|
| 6,589,370 B1 * | 7/2003 | Dubois et al. | 148/403 |
| 6,670,283 B2 * | 12/2003 | Baker et al. | 438/758 |
| 6,764,773 B2 * | 7/2004 | Omachi et al. | 428/600 |
| 7,037,733 B2 * | 5/2006 | Shibata et al. | 438/11 |
| 7,198,671 B2 * | 4/2007 | Ueda | 117/84 |
| 7,330,041 B2 * | 2/2008 | McFadden | 324/750.06 |
| 2001/0027971 A1 * | 10/2001 | Sakurai et al. | 219/411 |
| 2002/0028314 A1 * | 3/2002 | Tischler et al. | 428/64.1 |
| 2004/0152312 A1 * | 8/2004 | Bader et al. | 438/689 |
| 2005/0277053 A1 * | 12/2005 | Platzer et al. | 430/270.1 |
| 2006/0060145 A1 * | 3/2006 | Van Den Berg et al. | 118/728 |
| 2006/0108325 A1 * | 5/2006 | Everson et al. | 216/88 |
| 2007/0031988 A1 * | 2/2007 | Agranov et al. | 438/60 |
| 2007/0105246 A1 * | 5/2007 | Maurice et al. | 438/14 |
| 2008/0124470 A1 * | 5/2008 | van den Berg et al. | 427/348 |
| 2010/0044705 A1 * | 2/2010 | Langer et al. | 257/51 |
| 2010/0308030 A1 * | 12/2010 | Maurin-Perrier et al. | 219/260 |

FOREIGN PATENT DOCUMENTS

| | | |
|---|---|---|
| WO | WO 2006/082467 | 8/2006 |
| WO | WO 2006082467 A1 * | 8/2006 |

OTHER PUBLICATIONS

Ohi, A. et al., "Post-Implantation Annealing Effects on the Surface Morphology and Electrical Characteristics of 6H-SiC Implanted with Aluminum", Materials Science Forum Trans Tech Publications Switzerland, vol. 389-393, pp. 831-834, (2002).

Nishizawa S. I. et al., "Effect of Radiation in Solid During SiC Sublimation Growth", Materials Research Society Symposium Proceedings, Materials Research Society, vol. 911, pp. 29-34, (2006).

* cited by examiner

DOPED SUBSTRATE TO BE HEATED

This application is a 371 filing of International Patent Application PCT/IB2008/000780 filed Mar. 25, 2008.

BACKGROUND

The invention relates to a substrate for depositing at least one useful layer intended to be used for producing electronic, optical or optoelectronic components, as well as a method for producing such a substrate.

More particularly, the substrate according to the invention may be adapted to implement the deposition of a layer, such as epitaxy or heteroepitaxy, in a nitride-based material—e.g. GaN, AlN, InN, alloys of these compounds (AlGaN, InGaN, etc.)—by an MBE (acronym for "Molecular Beam Epitaxy") process, or any other process using heating by infrared radiation. In particular, these types of materials are used for applications in high frequencies.

These layer deposition processes usually necessitate heating of the substrate so that its front face, arranged to nucleate the useful layer, reaches a temperature equal to a temperature determined by the deposition conditions and/or other conditions.

Thus a temperature necessary for thermal stripping the front face of the substrate, i.e. the deposition surface, may be reached.

Such thermal stripping of the front face may be necessary if contaminants are present therein or if the front face is covered by a protective layer. In the latter case, a protective layer in oxide may have initially been provided to protect the substrate from deterioration caused by extended storage and/or transport before deposition.

As an illustration, the minimum temperature necessary for thermal stripping a surface oxide layer of a substrate in Si or pSiC (polycrystalline SiC) is typically between approximately 700° C. and 1200° C., and more particularly on the order of 950° C.

This minimum temperature is on the order of 700° C. for stripping a substrate in GaN, 900° C. for a substrate in AlN, 1200° C. for a substrate in sapphire ($Al_2O_3$).

The heating source used to bring the front face of the substrate to the desired temperature is infrared radiation, which is converted into heat when it is absorbed by the substrate.

However, some substrates are not sufficiently absorbent to reach said temperature. For example, in the latter case, SiC, sapphire ($Al_2O_3$), GaN, AlN or ZnO are included.

It is thus necessary to find means of increasing the absorbency of these substrates to successfully achieve good stripping.

In addition, it is important to provide that these means implemented do not disturb the operation of the components to produce in the useful layer to deposit, such as the high-frequency operation of some components.

To increase infrared absorption while not disturbing the operation, particularly high-frequency operation, of components, providing an infrared absorbing layer placed on the rear face of the substrate, to convey heat, is known (US 2004/0152312, EP 0449 524, U.S. Pat. No. 5,296,385, WO 2006/082467). Using absorbent layers in α-Si (amorphous silicon) or in pSi (polycrystalline silicon) is thus known.

By choosing a substantial absorbent layer thickness and by providing enough infrared energy, the temperatures necessary for front face stripping may then be reached.

However, a too-thick thickness of the absorbent layer may lead to bending phenomena or even cracks in the absorbent layer or substrate if thermal (for example by different thermal coefficients of expansion) or structural (for example by different lattice parameters) incompatibilities exist between the materials used for the absorbent layer and for the substrate.

In some cases, one is thus forced to limit the thickness of the absorbent layer to prevent these phenomena so that the temperature necessary for good thermal stripping may be reached.

In addition, the infrared energy ensuring heating of the substrate may lead to excess in terms of economic costs if the energy necessary is too high and/or if furnaces operating at high power must be used.

Thus, a need exists to limit the costs of effective stripping, while guaranteeing good operation of the components to produce from the useful layer to deposit.

SUMMARY OF THE INVENTION

In order to reach this objective in particular and to resolve said problems, the invention proposes, according to a first aspect, a structure intended to be heated comprising a substrate for the deposition onto the front face of a useful layer intended to receive components for electronics, optics or optoelectronics, the structure furthermore containing doped elements that absorb infrared radiation so as to substantially increase infrared absorption by the structure so that said front face reaches a given temperature when a given infrared power is supplied to the structure, characterized in that at least one part of the doped elements have insufficient electrical activity or localization in the structure, such that they cannot disturb the operation of the components.

Other optional characteristics of this structure are:

the substrate has a suitable rear face roughness to increase the infrared absorption and thus the heating of the structure;

the rear face has a roughness of at least 50 nanometers—measured by a mechanical profilometry method with a KLA-Tencor P15 apparatus or optical profilometry;

the substrate is a bulk monocrystalline material in SiC, AlN, $Al_2O_3$, ZnO, GaN;

in a variation, the substrate comprises a support substrate in a material essentially transparent to said radiation, and the support substrate contains doping elements able to absorb said radiation; as the components to produce in the useful layer may operate at high frequencies, at least part of the dopant species may be electrically active and has a decreasing concentration by taking away from the rear face of the substrate so as to not cause RF losses during operation of the components; alternately, as the components to produce in the useful layer may operate at high frequencies, at least part of the doping elements contained in the support substrate may be electrically active and localized in a rear zone of the support substrate so as to be sufficiently far away from the useful layer to produce to not cause RF losses during operation of the components; alternately, as the components to produce in the useful layer may operate at high frequencies, said substrate may furthermore comprise one or more intermediate layers between the support substrate and the front face of said substrate, the intermediate layer or layers have a total thickness sufficient so that a doping, by doping elements that are at least in part electrically active distributed over the entire thickness of the support substrate, may not cause RF losses during operation of the components; the support substrate may be in a bulk material chosen from among: polycrystalline SiC, polycrystalline AlN, $Al_2O_3$, diamond, and the intermediate layer or layers may comprise a surface seed layer constituted of one or more of the following monocrystalline materials: Si, SiC, Ge, ZnO, GaAs, sapphire, semiconductor alloy comprising at least one element from group III and/or at least one element from group V; at least one part of the doping elements of the support substrate may be not electrically active;

the structure that in addition comprises an absorbent layer on the rear face of the substrate made in an infrared radiation absorbing material and with a given thickness so as to increase the heating of the structure by a given value; the structure may furthermore comprise an absorbent layer on the rear face of the substrate made in an infrared radiation absorbing material, with a given thickness and a given surface roughness so as to increase heating of the structure by a given value; the material constituting the absorbent layer may have a thermal expansion coefficient different from the material of the substrate, and the thickness of the absorbent layer may be less than a maximum thickness beyond which a bend of the structure may appear at considered temperatures; the absorbent layer may be doped with doping elements able to increase the absorption of infrared radiation by the absorbent layer; the doping elements are at least in part not electrically active and/or the substrate may be undoped; the absorbent layer may be made of one or more of the following materials: Si; Mb; Ta; Ti; W; a non transparent III/V alloy such as InP, GaAs; doped pSiC; doped pAlN; doped $Al_2O_3$; doped $SiO_2$; doped $Si_3N_4$; doped amorphous SiC; doped diamond; doped AlN; the substrate may be in Si on pSiC and the absorbent layer in doped SiC with infrared absorbing elements and having a thickness of at least one micrometer and at least 50 nanometers of rear face roughness;

the structure is made sufficiently absorbent so that its front face reaches a sufficient temperature to undergo stripping; the given temperature may be between 700° C. and 1200° C.

According to a second aspect, the invention proposes a method of making a structure intended to be heated for the deposition onto the front face of a useful layer intended to receive components for electronics, optics or optoelectronics, the structure comprising a substrate presenting said front face, the method comprising doping of the structure with doping elements that absorb infrared radiation so as to substantially increase infrared absorption by the structure, characterized in that the doping is implemented so that at least one part of the doped elements have insufficient electrical activity or localization in the structure, such that they cannot disturb the operation of the components.

Other optional characteristics of this method are:

the method furthermore comprises the production of the structure, and doping is implemented when the structure is produced;

the method furthermore comprises a step of roughness rectification so that the rear face of the substrate has a roughness able to modify the infrared absorbing properties of the structure;

as the components to produce in the useful layer operate at high frequencies, said doping is implemented such that at least one part of the doping species are electrically active and have a concentration that decreases by moving away from the rear face of the substrate;

in a variation, as the components to produce in the useful layer operate at high frequencies, said doping is implemented such that at least one part of the doping species are electrically active and localized in a rear zone of the substrate so as to be sufficiently far away from the useful layer to produce to not cause RF losses during operation of the components;

in a variation, the components to produce in the useful layer operate at high frequencies, in that it furthermore comprises producing the substrate by forming one or more intermediate layers on the front face of the support substrate, the intermediate layer or layers having a total thickness sufficient so that doping with the elements that are at least in part electrically active over the entire thickness of the support substrate cannot cause RF losses during operation of the components, and in that it comprises doping of the support substrate over its entire thickness;

at least one part of the doping elements used during doping of the substrate are not electrically active;

the method furthermore comprises the formation of an absorbent layer on the rear face of the substrate with an infrared radiation absorbing material, the method may comprise doping of the absorbent layer with doping elements able to increase the infrared absorption of the absorbent layer; the doping elements may be at least in part not electrically active, the method may furthermore comprise a roughness rectification step so that the absorbent layer has a roughness that is able to increase its infrared absorbing properties.

According to a third aspect, the invention proposes a method of forming a useful layer intended to be used for producing components for electronics, optics or optoelectronics, characterized in that the method comprises the following steps:

(a) produce a structure intended to be heated corresponding to said method of producing a structure;

(b) emit said infrared radiation so that the front face of the substrate reaches a given temperature in situ, in a deposition chamber (c) deposit the useful layer on the front face of the substrate in the deposition chamber.

Other optional characteristics of the latter method to form a useful layer are:

step (b) is implemented so that the given temperature may lead to thermal stripping from said front face in situ, in the chamber for depositing the useful layer;

the method furthermore comprises, before step (b), a formation of a protective layer on the front face of said substrate, and in that step (b) is implemented so as to strip off this protective layer in situ, in the useful layer deposition chamber; said protective layer may be in silicon oxide, and said given temperature is between 900° C. and 1200° C.;

step (c) is implemented by MBE.

BRIEF DESCRIPTION OF THE DRAWINGS

Other characteristics, objects and advantages will appear more clearly upon reading the following non-limiting description, illustrated by the following figures.

DETAILED DESCRIPTION OF THE INVENTION

Figure 1:
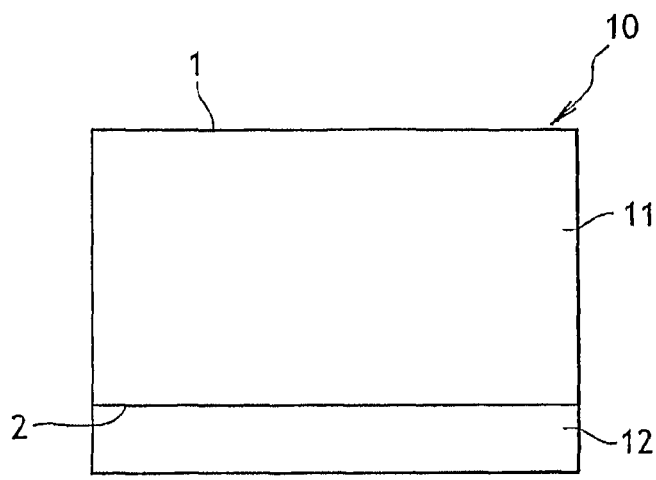
FIG. 1 represents a structure according to the invention comprising a substrate in a bulk material.

FIG. 1 shows a structure 10 for the deposition, such as crystal growth, of atomic elements. These atomic elements may in particular comprise a semiconductor or crystalline material, such as for example a nitride semiconductor, to form for example an alloy comprising at least one atomic element from column III and a nitrogen element such as InN, GaN, AlN, InGaN or compounds of these different elements. This deposition will take place on the front face 1 of structure 10. This front face 1 may in particular be adapted to epitaxy ("epi-ready"), meaning that it has a surface prepared for the next nucleation.

Structure 10 is composed here of two parts:
- a substrate 11 for the subsequent deposition, this substrate having a front face 1 that may be for example adapted to the subsequent nucleation of elements to deposit during crystal growth;
- an absorbent layer 12 formed onto the rear face 2 of substrate 11, and made in an infrared radiation absorbing material—the rear face 2 logically being the face of substrate 11 opposite from front face 1.

With reference to FIG. 1, substrate 11 may be in a bulk monocrystalline material, such as SiC, sapphire, AlN, GaN, ZnO, which are materials adapted to crystal growth.

Figure 2:
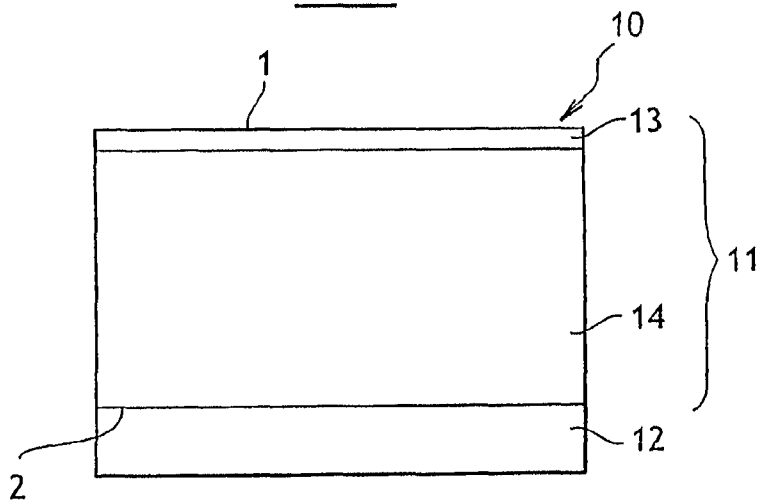
FIG. 2 represents a structure according to the invention comprising a composite substrate.

According to a first variation and with reference to FIG. 2, substrate 11 is composed of a support substrate 14, for example bulk SiC or bulk sapphire, and at least one front layer 13 made of a semiconductor material chosen to receive and nucleate on its front face 1 during crystal growth. In particular, its lattice parameter and crystal quality may be carefully chosen to subsequently deposit a useful layer that will have a chosen constraint and low defect density.

The support substrate 14 may be made of a material chosen from among polycrystalline or monocrystalline SiC, polycrystalline or monocrystalline AlN, sapphire, ZnO, GaN, and diamond.

The front layer 13 may be made of a material chosen from among monocrystalline Si, monocrystalline SiC, Ge, ZnO, GaAs, sapphire, or a semiconductor alloy comprising at least one element from group III and/or at least one element from group V such as GaN, AlN, InN, InGaN, or AlGaN.

In the case where the seed layer 13 is in silicon, Si having a low oxygen content and high resistivity will preferentially be chosen for this front layer, and even more preferentially, FZ silicon will be chosen since the floating zone production process enables Si that is purer and more resistive to be obtained, and thus better limits possible RF losses.

The front layer 13 may be made by epitaxy from the support substrate 14 or by bonding with the support substrate 14 by using a layer transfer technique. One may thus employ the Smart Cut™ technique, of which one may for example find a description in "Silicon-On-Insulator Technology: Materials to VLSI, 2nd Edition" by Jean-Pierre Colinge (Kluwer Academic Publishers, p. 50 and 51).

Figure 3:
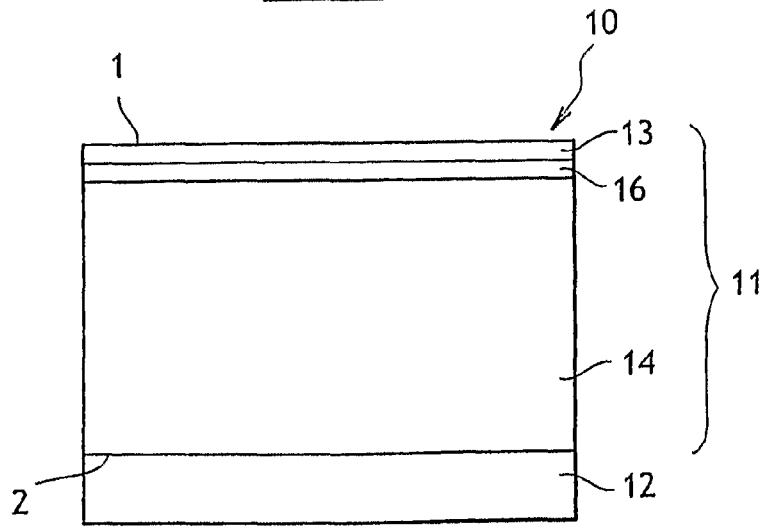
FIG. 3 represents a structure according to the invention comprising another composite substrate.

According to a second variation and with reference to FIG. 3, substrate 11 is composed of a support substrate 14, for example made in poly SiC or sapphire, a front layer 13 to receive elements to deposit on the front face 1 and an intermediate layer 16 buried between the front layer 13 and the support substrate 14.

The buried layer 16 may be made of a dielectric or any other material allowing the front layer 13 to be bonded with the support substrate 14, such as a silicon oxide ($SiO_2$), amorphous or polycrystalline silicon, silicon nitride ($Si_3N_4$), silicon oxynitride ($Si_xO_yN_z$), diamond, amorphous or polycrystalline SiC, amorphous or polycrystalline AlN.

The materials chosen for the support substrate 14 and for the front layer 13 may be identical to those chosen in the embodiment according to FIG. 2.

The front layer 13 and the buried layer 16 may be made by bonding with the support substrate 14 by using a layer transfer technique, the layer to bury 16 being formed on one and/or the other of the surfaces to bond. In particular, the transfer technique known as Smart Cut™, well known to the person skilled in the art, implemented by the SOITEC company, may be employed.

Whatever the nature of the substrate 11, an absorbent layer 12 is made on the rear face 2 of substrate 11, in an infrared radiation absorbing material.

This absorbent material 12 may be made in a non-metallic material, in particular in polycrystalline or amorphous silicon.

Amorphous or polycrystalline silicon is a material that is particularly infrared absorbent.

This polycrystalline or amorphous state may be obtained by implementing known epitaxy techniques such as LPCVD ("Low Pressure Chemical Vapor Deposition") or PECVD ("Plasma Enhanced Chemical Vapor Deposition") at low temperatures (typically under 600° C.). The α-Si is typically done around 580° C., and pSi around 620° C.

In addition, a sufficiently thick (that is, more than approximately 1 μm in thickness) absorbent layer 12 of silicon may easily be made, which enables good heating of structure 10 by infrared radiation.

In a variation, polycrystalline silicon may be preferred since it is compatible with the chemical treatments and cleanings usually utilized. In addition, its temperature resistance allows it to be stable during the epitaxy process. It is also interesting to note that it is not desorbed even in the ultra high vacuum necessary for MBE type epitaxy.

Other absorbent materials may be used, such as Ge, monocrystalline Si, and a non-transparent III/V alloy such as InP, GaAs which may be deposited by a low-cost technology and quality. One advantage procured by these materials resides in that their use reduces the risks of contamination of the front face 1 when it is constituted in the same material (but of better quality for nucleation). In addition, in the case where one wants to measure the temperature reached by structure 10, the infrared emissivity of structure 10 measured by pyrometry will be identical on the rear face 2 and on front face 1, which will prevent the risk of taking a wrong temperature.

Other mainly transparent materials may also be used if they are doped by conductive elements; this is the case with pSiC, pAlN, $Al_2O_3$, $SiO_2$, $Si_3N_4$, amorphous SiC, diamond and AlN.

In addition, one may use the metals Molybdenum, Tantalum, Titanium, Tungsten, and a Silicon/Tungsten stack for optimal adhesion between face 2 and the metal, these metals may be deposited by IBS ("Ion Beam Sputtering"). In fact, these metals are not subject to evaporation, even at temperatures around 1200° C. The metals may possibly be eliminated, after epitaxy, by wet chemical etching without etching the useful layer in GaN, for example, to not disturb the subsequent operation of the device made in this useful layer.

This is how the absorbent layer 12 enables infrared heating of the structure 10, to "clean" the front face 1, then optionally make the deposition with infrared heating of a useful layer on this structure 10. This absorbent layer 12 is especially useful when substrate 11 is made in a bulk material that is at least partially infrared transparent such as a bulk SiC or a bulk sapphire (with reference to FIG. 1), or when the substrate 11 is a composite structure (with reference to FIGS. 2 and 3) comprised of a support substrate 14 at least partially infrared transparent and a front layer 13 that is not sufficiently thick to ensure heating of structure 10 by infrared absorption.

The absorbent layer 12 is formed on the rear face 2 of substrate 11 during or after the formation of substrate 11.

For example, if substrate 11 is composed of a support substrate 14 and a front layer 13, the front layer 13 having been transferred on the support substrate 14 for example by a Smart Cut™ type technique, the absorbent layer 12 may be formed before or after transfer of the front layer 13.

According to the invention, the type, thickness and roughness of the absorbent layer 12 and/or substrate 11 are controlled.

It should be noted that the rougher the surface of the absorbent layer 12, the less infrared radiation is reflected and the more infrared radiation is absorbed by the absorbent layer 12. Consequently, the rougher the absorbent layer 12, the more the substrate 11 is heated.

The desired roughness may be reached by a rectification step by chemical and/or mechanical roughening such as polishing with a coarse grain.

This rectification may be carried out directly on the absorbent layer 12 and/or on the rear face 2 of substrate 11 before the formation of the absorbent layer 12.

In fact, in this latter case, the roughness of the absorbent layer 12 reproduces the roughness profile of the rear face 2 of substrate 11, by smoothing it or by possibly accentuating it a little. For example, a layer 12 of α-Si with 3 μm of thickness, deposited on a surface presenting a roughness of 80 nm (measured by a mechanical profilometry method with a KLA-Tencor P15 apparatus or optical profilometry) may present a shift in its surface roughness by + or −10 nm in comparison to the 80 nm.

For example, one may choose roughnesses for the rear face 2 greater than a roughness corresponding to a mirror finish (equal to or less than 40 nm), particularly greater than 50 nm, in particular around 80 nm or 120 nm or 200 nm providing substantial results on reducing the thickness of the absorbent layer 12 or the necessary heating power.

However, the roughness is not limited to 200 nm but to a maximum possible roughness to be obtained on the considered material.

Thus, by controlling the roughness of the rear face 2 of substrate 11, it is possible to control the roughness of the absorbent layer 12.

The thickness of the absorbent layer 12 is preferentially greater than approximately 0.1 μm, until reaching approximately 5 μm. However, the person skilled in the art may have to increase the thickness above 5 μm if he wishes to increase the front face 1 temperature and if the TEC differentials and lattice parameters allow this, or may even reduce the heating power.

For example, to obtain a front face 1 temperature on the order of 700° C., one may choose a substrate 11 in monocrystalline Si (around 0.5 micrometers in thickness) on the front face 1 on a support substrate in pSiC, and an absorbent layer 12 on the rear face of pSiC with 1 micrometer of thickness and approximately 50 nm of roughness.

By controlling the roughness of substrate 11, it is thus possible to determine the thickness of the absorbent layer 12 to obtain a given quantity of heat produced, if the filament of an infrared radiation furnace is heated with a given power.

Similarly, by controlling the roughness and thickness of the layer, while remaining within the physical constraint limits, one may reduce the heating power necessary to precisely obtain the desired temperature at the front face 1 (close to 100° C.).

One advantage that may be found when the roughness of the rear face 2 of substrate 11 is controlled, rather than that of the absorbent layer 12, is that the roughness specifications may be taken into consideration at the very beginning of the structure 10 production process, and on the bulk material. In fact, whether the substrate 11 is completely bulk (FIG. 1) or partially bulk (FIGS. 2 and 3), the rear face 2 may be that of a wafer in a bulk material. Such being the case, the manufacturers of such wafers usually implement a post-production polishing according to the client's specifications, mainly to reduce the initial deformation of the wafer produced. Thus this polishing may at that time be implemented according to the roughness specifications given for the rear face 2, without necessarily increasing the cost of the wafer.

One may thus precisely specify a roughness of the rear face 2 without unduly affecting the cost of the product.

And the final structure 10 will be improved with relation to the prior art, given that identical temperatures may be reached with:

a thinner absorbent layer 12 and/or
lower infrared power provided.

In the second case, one may in particular use less powerful furnaces or reactors.

In any case, the invention brings about savings in costs and energy.

Structure 10 thus allows higher temperatures than those from the prior art to be reached, yet by using a similar absorbent layer 12 thickness and infrared power.

Thus, the invention enables increased heating effectiveness.

Another advantage of the invention may be found when the thickness of the absorbent layer 12 is limited to a maximum thickness that may cause the appearance of bending or even cracks because of a too big difference in the TEC (Thermal Expansion Coefficient) with substrate 11. An increase in the roughness of the absorbent layer 12 according to the invention in fact allows the desired thermal performances to be reached (when subjected to infrared radiation) while conserving a thickness of layer 12 equal to or less than the maximum thickness. Some roughened substrates according to the invention may thus be effectively stripped from front face 1 while not presenting detrimental thermal constraints, which could not be the case in the absence of roughnesses.

In these cases where the thickness is limited because of physical constraints, an increase in the roughness of absorbent layer 12 enables the desired thermal performances to be reached (when subjected to infrared radiation) that could not be reached in the absence of roughness.

To illustrate the influence of roughness on the absorption coefficient of absorbent layer 12, one may take a first example of an SopSiC type (comprising a support substrate 14 in pSiC and a front layer 13 in monocrystalline Si) structure 10, undergoing infrared radiation corresponding to the heating of a furnace filament to 1500 W, which reaches the same temperature of 950° C. in the front face 1 if it is equipped with an absorbent layer 12 in α-Si having a thickness of:

6 micrometers if the rear face 2 of the SopSiC is polished in the "mirror finish" manner (roughness 20 nm);

3 micrometers if the rear face of the SopSiC presents a roughness on the order of 80 nm.

Another advantage to the presence of an absorbent layer 12 on the rear face 2 resides in that it may contribute, according to its stress state and thermal expansion coefficient, to reducing by compensation the intensity of the bending that is formed in the structure following the growth of a useful layer in one or more material or materials having a thermal expansion coefficient different from that of substrate 11—e.g. pSi has a lower thermal expansion coefficient than pSiC and reduces deformation of the latter during epitaxy of a useful layer in GaN at the higher expansion coefficient than pSiC.

One may again play on the roughness to reach a given absorbent layer 12 thickness allowing such compensation while reaching the desired substrate 11 temperature.

According to a second embodiment of the invention, the substrate 11 is a composite structure comprising a support substrate 14 that is at least partially infrared transparent. Doping of the support substrate 14 with doping species absorbing the chosen wavelengths is done here to make it more absorbent. One may then reduce or even eliminate the thickness of the absorbent layer 12, this latter being intrinsic or doped.

This substrate 11 advantageously comprises a roughness according to the invention such that even more infrared radiation is absorbed so that its front face 1 reaches a desired temperature.

However, by doping this support substrate 14, there exists a risk of diffusion by evaporation during the thermal treatment or treatments employed, such as a thermal treatment to remove a layer covering the front face of substrate 11.

The risk of diffusion by evaporation may be avoided by choosing a doping element having a low diffusion energy, that is, whose diffusion activation temperature is greater than the temperature employed.

For example, doping of the pSiC with boron, phosphorous, aluminum, nitrogen or other element(s) from groups III and V in a range of $10^{16}$ to $10^{20}$ at/cm$^3$ or from $10^{16}$ to $10^{18}$ at/cm$^3$, without an absorbent layer, should allow a temperature of 1100-1200° C. to be reached.

Optionally, a bonding layer in $SiO_2$ or $Si_3N_4$ corresponding to said buried layer 16 (see FIG. 3) is provided to constitute a barrier to the diffusion of doping agents, even at high temperature, in the front layer 13 or in the useful layer to deposit on the front layer 13.

Optionally, doping is carried out in the form of a doping element concentration gradient so as to present a higher concentration in the rear part of the support substrate 14.

RF losses in power applications, which results from the proximity of the electrically active doping elements with the support substrate 14—front layer 13 interface, and thus a proximity with the front face 1, would thus be minimized.

For example, for a support substrate 14 with a diameter of four inches and a thickness of 500 micrometers, doping on a thickness of 100 to 400 micrometers in the rear part would allow RF losses to be avoided.

Thus, doping may be controlled so that, according to the size of the device, its frequency of use and its remoteness from the doped part, the performances of the components to make in a useful layer deposited onto the front face 1 of structure 10 remain unchanged despite the presence of these doping species.

Optionally, a structure in layer 13 comprised between the support substrate 14 and the useful layer is provided sufficiently thick so that the doping species of the support substrate 14 do not diminish the performance of the components—i.e. so that RF losses due to the doping species are negligible.

Doping in the entire support substrate 14 is then made possible, while preventing RF losses.

In addition, as obtaining the doped substrate is made easier, doping may now be incorporated during the first production.

According to a third embodiment of the invention, the absorbent layer 12 is doped with the doping species that absorb the wavelengths chosen for heating the substrate 11.

This type of doping enables the absorption coefficient of the absorbent layer 12 for a given material to be increased.

This type of doping thus allows the thickness of absorbent layer 12 to be reduced for a given absorption coefficient. As seen previously for the first embodiment according to the invention, this allows higher temperatures of substrate 11 to be reached in the case where the thickness of the absorbent layer 12 must remain less than or equal to the maximum thickness.

This type of doping may thus allow new materials to be used, of the intrinsically transparent type for example, similarly to that seen for the first embodiment of the invention. In particular, it allows materials to be used for the absorbent layer 12 having a TEC close or even identical to that (or those) of substrate 11 and to avoid the formation of a bend during its deposition. For example, it is advantageous to deposit a rough absorbent layer 12 in doped SiC on the rear face of a substrate in undoped SiC or on a SopSiC type substrate. For example, an absorbent layer 12 of one micrometer with a roughness on the rear face of 50 nm enables the absorption power of structure 10, and thus the front face 1 temperature, to be increased.

The material of the absorbent layer 12 may also be chosen to present a TEC that allows compensation for the bend that is formed during deposition of the useful layer.

Doping of the SiC may be carried out by any element from groups III and V in a range of $10^{16}$ to $10^{20}$ at/cm$^3$.

Doping may be carried out during deposition of the absorbent layer 12 or by implantation after it has been deposited.

In the case where the roughness and thickness of the absorbent layer 12 are limited by physical constraints—e.g. quality of the deposition and/or thermal expansion constraints—and that, because of this, the desired temperature may not be reached in the structure, doping of the absorbent layer 12, done in a material that is already absorbent, may also be carried out.

Doping of substrate 11 may also be contemplated according to the desired applications.

According to a fourth embodiment, structure 10 comprises a doping obtained by non-electrically active doping elements, such as vanadium, oxygen, sulfur and selenium for a material in SiC.

Doping may be contemplated in a range of $10^{15}$ to $10^{20}$ at/cm$^3$.

Doping may be carried out, according to the composition of structure 10, in the entire volume of the bulk substrate 11, the support substrate 14 and/or the seed layer 13 and/or the absorbent layer 12, the doping may be incorporated during production of this substrate or deposition of the possible absorbent layer 12.

These non-electrically active doping agents increase the infrared absorption by structure 10 while guaranteeing a very low RF loss during application in high frequencies. In particular, contrary to electrically active doping agents, they may be provided in all of the volume of structure 10, including near the front face 1, for these RF applications.

This type of doping in addition comprises the same advantages as those already mentioned for the electrically active doping of the second and third embodiments.

In particular, following this doping, the thickness of absorbent layer 12 will be reduced or even eliminated.

It is also possible to carry out doping of the structure 10 by doping elements that are both electrically active and non-electrically active.

For example, an absorbent layer 12 in SiC doped with an electrically active element such as nitrogen at $10^{18}$ at/cm$^3$ with a thickness of 5 micrometers and a roughness of 120 nm, may be deposited on an SopSiC type structure wherein the totality of substrate 11 in pSiC is doped with a non-electrically active element such as vanadium at $10^{18}$ at/cm$^3$.

Similarly, a roughness adapted in the rear face of structure 10, for example 50, 80, 120 and preferably 200 nanometers, may be carried out to minimize the reflection of infrared radiation and thus contribute to increasing the absorption capacity of structure 10, as discussed in the first embodiment.

Optionally, according to the invention, a protective layer (not represented) is formed on the front face 1 of substrate 11, for example in SiC or Si, to protect the front face 1 of substrate 11 from contaminants and/or a treatment implemented during the following steps.

Preparation of front face 1 in view of the subsequent deposition may be done after this protective layer is removed.

This protective layer may be formed before or after formation of the absorbent layer 12.

It may, for example, be used to protect the front face 1 of substrate 11 from the deposition elements of the absorbent layer 12 during formation of the latter.

If thermal oxidation is used, the $SiO_2$ material may be formed on the two faces (front 1 and rear 2) of substrate 11.

The protective layer is advantageously removed in situ in the deposition chamber before deposition of the useful layer.

Heating of substrate 11 for the deposition (by subjecting at least one absorbent part to infrared radiation) may also be used to evaporate the contaminants, in addition to stripping the surface of a possible protective layer in situ, in the deposition chamber before making it active and possibly ready for epitaxy.

In the case where the protective layer is in $SiO_2$, a temperature of 900-1200° C. is necessary.

The absorbent layer 12 according to the invention allows the heating temperature of the front face 1 of substrate 11 to be increased with relation to substrates from the prior art, while taking physical constraints into consideration.

Certain thermal stripping procedures that were difficult to contemplate before in infrared heating equipment are now made possible by using a structure 10 according to the invention.

Epitaxy of the useful layer is then implemented in situ, in the infrared heating chamber.

Embodiments

EXAMPLE 1

Deposition of an Absorbent Layer 12 in Amorphous or Polycrystalline Silicon on a Bulk Substrate 11 in pSiC Formation of a protective layer of front face 1 of substrate 11 by thermal oxidation between 900 and 1300° C. in a furnace at atmospheric pressure in an oxygen atmosphere.

Deposition of silicon, for example over all of substrate 11, by LPCVD at 620° C. or only on the rear face 2 by PECVD, at a temperature of less than 580° C. The silicon layer may present, for example, a thickness of 5 micrometers with a roughness of 120 nm.

If necessary, elimination of the silicon in the front face 1 by selective etching that does not affect the protective layer from the first step, for example plasma-assisted dry etching (RIE) that allows the silicon to be selectively etched, since it is ineffective on $SiO_2$, or by "spin etching" type chemical etching (HF/HNO3).

Selective HF etching of the protective layer of SiO2 contaminated by the previous steps.

Formation of oxide by RCA type cleaning (Radio Corporation of America cleaning—for more information, see for example the work by W. Kern and D. A. Puotinen, in *RCA Rev.*, 31, 187 (1970)) to form a new protective layer.

Elimination of the oxide layer by thermal stripping at 1100° C., for 30 seconds to 1 minute in ultra high vacuum, in an epitaxy chamber.

Deposition of the useful layer of GaN in situ in the chamber.

EXAMPLE 2

Composite Substrate 11 Having a Front Layer 13 in Si (111) on a Support Substrate 14 in pSiC: Deposition of the Absorbent Layer 12 in Silicon After Bonding Formation of an oxide layer by thermal oxidation between 800 and 1200° C. of a wafer, for example in Si (111), in order to protect the wafer during subsequent implantation.

Implantation of atomic species through the oxide layer at a given dose and energy to form an embrittlement zone at a desired depth.

Cleaning contamination due to the implantation and preparation of the surface for bonding with a support substrate 14 (e.g. hydrophilization, superficial activation) from the oxide layer. It is also possible to completely etch the oxide layer before preparing the surface of the Si (111) for bonding.

Bonding with the support substrate 14 whose surface was prepared.

Detachment at the embrittlement zone by supplying mechanical and/or thermal energy (Smart Cut™ technique).

High-temperature stabilization treatment that oxidizes the silicon (111) front face 1 and enables the front face 1 to be protected during deposition of the absorbent layer 12. This treatment leads to the formation of a protective layer for the front face 1 of substrate 11.

Formation of an absorbent layer 12 by deposition of amorphous or polycrystalline silicon onto the rear face 2 of the support substrate 14 of 5 micrometers with a roughness of 120 nm. If there is also deposition on the front face 1, etching is possible at this level by the techniques seen previously.

Selective HF etching of the protective layer of $SiO_2$.

Formation of oxide by RCA type cleaning to form a new protective layer.

Thermal stripping of the protective layer of the front face 1 in ultra high vacuum in the epitaxy chamber.

Deposition of the useful layer of GaN in situ in the chamber.

EXAMPLE 3

Composite Substrate 11 Comprising a Front Layer 13 in Si (111) and a Support Substrate 14 in pAlN or Other Nitride Semiconductor: Deposition of the Absorbent Layer 12 Before Bonding Formation of an oxide layer by thermal oxidation between 800 and 1200° C. of a wafer, for example in Si (111), in order to protect the wafer during subsequent implantation.

Implantation of atomic species through the oxide layer at a given dose and energy to form an embrittlement zone at a desired depth.

Cleaning contamination due to the implantation and preparation of the surface for bonding with a support substrate 14 (e.g. hydrophilization, superficial activation) from the oxide layer. It is also possible to completely etch the oxide layer before preparing the surface of the Si (111) for bonding.

In addition:—deposition of an absorbent layer 12 in amorphous or polycrystalline silicon in the rear face 2 of the support substrate 14 (thickness of 5 micrometers with a roughness of 120 nm). If there is also deposition on the front face 1, etching is possible at this level by the techniques seen previously.

Preparation of the surface of support 14 for bonding

Bonding with the wafer of Si (111)

Detachment at the embrittlement zone by supplying mechanical and/or thermal energy (Smart Cut™ technique).

High-temperature stabilization treatment that oxidizes the front face 1 of silicon (111). This treatment leads to the formation of a protective layer for the front face 1 of substrate 11.

Selective HF etching of the too-thick protective layer of $SiO_2$.

Formation of oxide by RCA type cleaning to form a new thin protective layer.

Thermal stripping of this protective layer of the front face 1 in ultra high vacuum in the epitaxy chamber.

Deposition of the useful layer of GaN in situ in the chamber.

EXAMPLE 4

Deposition of a Metallic Absorbent Layer 12 on a Substrate 11 in Sapphire Formation of a protective layer on the front face 1 of substrate 11 by deposition of resin.

Deposition of the absorbent metallic layer 12 on the rough rear face 2 by IBS (Ion Beam Sputtering) or by Joule heating of the metal to deposit, until obtaining a thickness in a range of 0.1 to 2 micrometers, preferably on the order of 1 micrometer.

Cleaning the front face 1 by eliminating the resin by an acetone treatment.

Evaporation of surface contaminants formed in open air by thermal stripping of the front face 1 in ultra high vacuum in the MBE chamber.

Epitaxy of the useful layer in situ in the epitaxy chamber.

Possible elimination of the rear metallic absorbent layer 12 by wet etching.

For example, Molybdenum, Tantalum, Tungsten and Silicon/Tungsten may be eliminated by etching with HCl.

Molybdenum, in particular, may be eliminated by etching with $H_2O_2$ or more reactive $NH_3/H_2O_2$, Titanium and Tungsten by HF etching.

EXAMPLE 5

SopSiC Structure with Non-Electrically Active Doping

Formation of an oxide layer by thermal oxidation between 800 and 1200° C. of a wafer, for example in Si (111), in order to protect the wafer during subsequent implantation.

Implantation of atomic species through the oxide layer at a given dose and energy to form an embrittlement zone at a desired depth.

Cleaning contamination due to the implantation and preparation of the surface for bonding with a support substrate 14.

In addition: Formation of a support substrate 14 of pSiC by CVD (Chemical Vapor Deposition) deposition. This substrate is doped with vanadium at $10^{18}$ at/cm$^3$ during deposition and presents a rear face with a roughness of 120 nm. Doping may also be carried out after the formation of the substrate by implantation of the doping agent followed by an annealing step to ensure diffusion of the latter throughout the substrate.

Preparation of the surface of support 14 for bonding

Bonding with the wafer of Si (111)

Detachment at the embrittlement zone by supplying mechanical and/or thermal energy (Smart Cut™ technique).

High-temperature stabilization treatment that oxidizes the front face 1 of silicon (111). This treatment leads to the formation of a protective layer for the front face 1 of substrate 11.

Selective HF etching of the too-thick protective layer of $SiO_2$.

Formation of oxide by RCA type cleaning to form a new thin protective layer.

Thermal stripping of this protective layer of the front face 1 in ultra high vacuum in the epitaxy chamber.

Deposition of the useful layer of GaN in situ in the chamber.

During implementation of one or the other of these structure 10 production processes as well as the formation of a useful layer in the front face 1 of this structure 10, one or more of said four following embodiments of the invention, taken alone or in combination, are implemented in order to reach a given temperature (which may be that used during thermal stripping) in the front face 1 of substrate 11:

controlling the roughness of the rear face of structure 10, comprising or not comprising an absorbent layer 12, by possibly implementing roughening of its surface or of the rear face 2 of substrate 11, to thus facilitate the absorption of infrared radiation;

in the case of a composite structure, doping of the support substrate 14 to make it more infrared absorbent.

suitable doping of the absorbent layer 12.

doping with non-electrically active doping elements.

It should be noted that, in conformance with the invention, one may provide a structure 10 without an absorbent layer 12 (not represented), as for example a structure 10 constituted of a bulk substrate 11, made more absorbent to infrared radiation thanks to suitable doping and/or roughening in the rear face according to the invention.

What is claimed is:

1. A semiconductor structure comprising a substrate having a rear face and a front face that is configured and prepared to receive a useful layer thereon, with the useful layer intended to receive components for electronic, optic and optoelectronic applications, wherein the substrate beneath the front face contains infrared radiation absorbing doping elements in an amount sufficient to absorb infrared radiation and heat the front face when infrared power is applied to the structure, with the doping elements placed to have electrical activity or localization in the substrate sufficiently far away from the useful layer that they do not disturb operation of the subsequently applied components, and wherein the rear face of the substrate has a roughness of at least 50 nanometers when measured by a mechanical or optical profilometry method.

2. The structure according to claim 1, wherein the substrate is a bulk monocrystalline material of SiC, AlN, Al2O3, ZnO, or GaN and includes sufficient doping elements so that the front face can reach a temperature of between 700° C. and 1200° C.

3. The structure according to claim 1, wherein the substrate comprises a support substrate made of an essentially infrared radiation transparent material and which contains the doping elements.

4. The structure according to claim 3, wherein at least part of the doping elements are electrically active elements and are present to provide a decreasing concentration from the rear face of the substrate in the direction of the front face.

5. The structure according to claim 3, wherein at least part of the doping elements are electrically active elements that are localized near the rear face of the substrate.

6. The structure according to claim 3, wherein substrate further comprises one or more intermediate layers between the support substrate and the front face of the substrate, with the intermediate layer or layers having a total thickness sufficient to space the front face of the substrate away from the doping elements so that the doping elements do not disturb the operation of the components that the useful layer subsequently receives, and wherein the entire support substrate includes the doping elements.

7. The structure according to claim 6, wherein the support substrate is a bulk material of polycrystalline SiC, polycrystalline AlN, Al2O3, or diamond, and the intermediate layer or layers comprises at its surface a seed layer constituted of one or more of monocrystalline Si, SiC, Ge, ZnO, GaAs, sapphire, or a semiconductor alloy comprising at least one element from group III or at least one element from group V.

8. A semiconductor structure comprising a substrate having a rear face and a front face that is configured and prepared to receive a useful layer thereon, with the useful layer intended to receive components for electronic, optic and optoelectronic applications, wherein the substrate beneath the front face contains infrared radiation absorbing doping elements in an amount sufficient to absorb infrared radiation and heat the front face when infrared power is applied to the structure, with the doping elements placed to have electrical activity or localization in the substrate sufficiently far away from the useful layer that they do not disturb operation of the subsequently applied components, wherein at least some of the doping elements of the support substrate are non-electrically active.

9. The structure according to claim 1, wherein the rear face comprises an absorbent layer made of an infrared radiation absorbing material and having a thickness of at least 0.1 μm and the recited surface roughness of at least 50 nm.

10. The structure according to claim 9, wherein the absorbent layer is made of a material that has a thermal expansion coefficient that is different from the material of the substrate, and the thickness is less than a maximum thickness which would cause bending of the structure when infrared power is supplied to the structure.

11. The structure according to claim 9, wherein the absorbent layer is made of one or more of Si; Mb; Ta; Ti; W; a non-transparent III/V alloy such as InP, GaAs; doped pSiC; doped pAlN; doped Al2O3; doped SiO2; doped Si3N4; doped amorphous SiC; doped diamond, or doped AlN.

12. The structure according to claim 9, wherein the substrate is Si on pSiC and the absorbent layer is SiC doped with the elements for absorbing infrared radiation and having a thickness of at least one micrometer and the rear face has a roughness of at least 50 nanometers.

13. A method for making a semiconductor structure comprising a substrate having a rear face and a front face that is configured and prepared to receive a useful layer thereon, with the useful layer intended to receive components for electronic, optic and optoelectronic applications, which comprises doping the substrate with infrared radiation absorbing doping elements in an amount sufficient to absorb infrared radiation and heat the front face when infrared power is applied to the structure, with the doping elements placed to have electrical activity or localization in the substrate sufficiently far away from the useful layer that they do not disturb operation of the subsequently applied components, and treating the rear face of the substrate to provide a roughness of at least 50 nanometers measured by a mechanical or optical profilometry method.

14. The method according to claim 13, wherein the doping is implemented when the structure is produced.

15. The method according to claim 13, wherein at least part of the doping elements are electrically active elements that are provided in the structure to present a decreasing concentration from the rear face of the substrate toward the front face.

16. The method according to claim 13, wherein at least part of the doping elements are electrically active elements that are localized near the rear face of the substrate.

17. The method according to claim 13, which further comprises forming one or more intermediate layers on the front face of the substrate, wherein the intermediate layer or layers having a total thickness sufficient to space the front face of the substrate away from the doping elements so that the doping elements do not disturb the operation of the components that the useful layer subsequently receives, and wherein the support substrate is provided with the doping elements over its entire thickness.

18. The method according to claim 13 which further comprises forming an absorbent layer on the rear face of the substrate with an infrared radiation absorbing material.

19. The method according to claim 18, wherein the infrared radiation absorbing material of the absorbent layer is provided by doping of the absorbent layer with doping elements that absorb infrared radiation.

20. A method for making a semiconductor structure comprising a substrate having a rear face and a front face that is configured and prepared to receive a useful layer thereon, with the useful layer intended to receive components for electronic optic and optoelectronic applications, which comprises doping the substrate with infrared radiation absorbing doping elements in an amount sufficient to absorb infrared radiation and heat the front face when infrared power is applied to the structure, with the doping elements placed to have electrical activity or localization in the substrate sufficiently far away from the useful layer that they do not disturb operation of the subsequently applied components, wherein at least some of the doping elements are non-electrically active.

21. A method of forming a useful layer intended to be used for producing components for electronic, optic or optoelectronic applications, which comprises:
    producing a structure according to claim 13;
    applying infrared radiation to the structure to heat it to a temperature that enables deposition of the useful layer on the front face; and
    depositing the useful layer onto the front face of the heated substrate.

22. A method of forming a useful layer intended to be used for producing components for electronic, optic or optoelectronic applications, which comprises:

producing a structure for making a semiconductor structure comprising a substrate having a rear face and a front face that is configured and prepared to receive a useful layer thereon, with the useful layer intended to receive components for electronic, optic and optoelectronic applications, which comprises doping the substrate with infrared radiation absorbing doping elements in an amount sufficient to absorb infrared radiation and heat the front face when infrared power is applied to the structure, with the doping elements placed to have electrical activity or localization in the substrate sufficiently far away from the useful layer that they do not disturb operation of the subsequently applied components, applying infrared radiation to the structure to heat it to a temperature that causes stripping of the front face and that subsequently enables deposition of the useful layer on the front face; and depositing the useful layer onto the front face of the heated substrate by molecular beam epitaxy.

23. The method according to 22, which further comprises, before applying the infrared radiation, forming a protective layer on the front face of the substrate, so that the subsequently applied infrared radiation causes stripping of the protective layer.

24. The method of claim 23, wherein the protective layer is silicon oxide, and the temperature reached by the front face of the substrate is between 700° C. and 1200° C.

25. The structure according to claim 8, the rear face of the substrate has a roughness of at least 50 nanometers when measured by a mechanical or optical profilometry method.

* * * * *

UNITED STATES PATENT AND TRADEMARK OFFICE
CERTIFICATE OF CORRECTION

PATENT NO. : 8,198,628 B2  
APPLICATION NO. : 12/530606  
DATED : June 12, 2012  
INVENTOR(S) : Langer et al.

It is certified that error appears in the above-identified patent and that said Letters Patent is hereby corrected as shown below:

Column 15:  
Line 2 (claim 2, line 2), change "AIN" to -- A1N --.  
Line 29 (claim 7, line 3), change "AIN" to -- A1N --.  
Line 61 (claim 11, line 4), change "pAIN" to -- pA1N --.  
Line 62 (claim 11, line 5), change "AIN" to -- A1N --.

Column 16:  
Line 46 (claim 20, line 5), change "electronic optic" to -- electronic, optic --.

Signed and Sealed this  
Thirty-first Day of July, 2012

David J. Kappos  
*Director of the United States Patent and Trademark Office*